(12) United States Patent
Foong et al.

(10) Patent No.: US 8,901,756 B2
(45) Date of Patent: Dec. 2, 2014

(54) CHIP POSITIONING IN MULTI-CHIP PACKAGE

(71) Applicant: Spansion LLC, Sunnyvale, CA (US)

(72) Inventors: Sally Foong, Milpitas, CA (US); Seshasayee Gaddamraja, Santa Clara, CA (US); Teoh Lai Beng, Penang (MY); Lai Nguk Chin, Penang (MY); Suthakavatin Aungkul, Patumtanee (TH)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/724,897

(22) Filed: Dec. 21, 2012

(65) Prior Publication Data

US 2014/0175613 A1    Jun. 26, 2014

(51) Int. Cl.
*H01L 23/02*    (2006.01)
*H01L 21/77*    (2006.01)
*H01L 23/544*    (2006.01)

(52) U.S. Cl.
CPC .............. *H01L 23/544* (2013.01); *H01L 21/77* (2013.01)
USPC ................................... 257/797; 257/E23.179

(58) Field of Classification Search
CPC ........ H01L 23/48; H01L 23/544; H01L 24/81
USPC .......................................... 257/797, E23.179
See application file for complete search history.

(56) References Cited

U.S. PATENT DOCUMENTS 7,227,252 B2 *  6/2007  Bolken et al. ................. 257/686
2001/0021548 A1  9/2001  Yokota
2005/0161837 A1 *  7/2005  Matsui .......................... 257/797
2008/0268350 A1  10/2008  Yang
2008/0284048 A1  11/2008  Kim et al.
2011/0241708 A1  10/2011  Chen

FOREIGN PATENT DOCUMENTS

JP    3-276740 A    12/1991
KR   10-0809726 B1   3/2008

OTHER PUBLICATIONS

International Search Report and Written Opinion of the International Searching Authority for International Application No. PCT/US2013/076154, mailed Apr. 28, 2014.
English language abstract of Japanese patent document 3-276740 A.

* cited by examiner

*Primary Examiner* — Andy Huynh
(74) *Attorney, Agent, or Firm* — Sterne, Kessler, Goldstein & Fox P.L.L.C.

(57) ABSTRACT

Embodiments of the present invention include a substrate package, a method for multi-chip packaging, and a multi-chip package. For example, the substrate package includes a first set of reference markers and a second set of reference markers. The first set of reference markers is disposed on the substrate package, where the first set of reference markers is configured to provide a first alignment for positioning a first integrated circuit (IC) and a second alignment for positioning a second IC on the substrate package. Further, the second set of reference markers is disposed at a different location on the substrate package than the first set of reference markers, where the second set of reference markers is configured to provide confirmation of the first alignment and the second alignment.

14 Claims, 14 Drawing Sheets

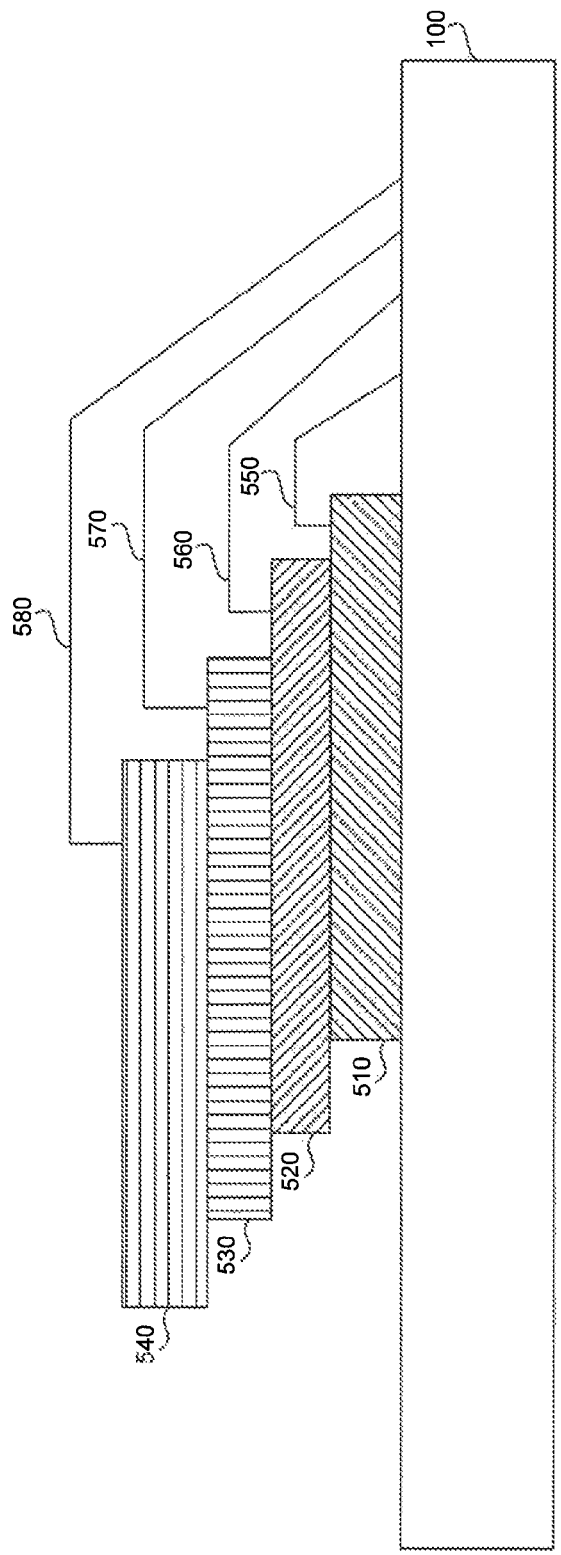

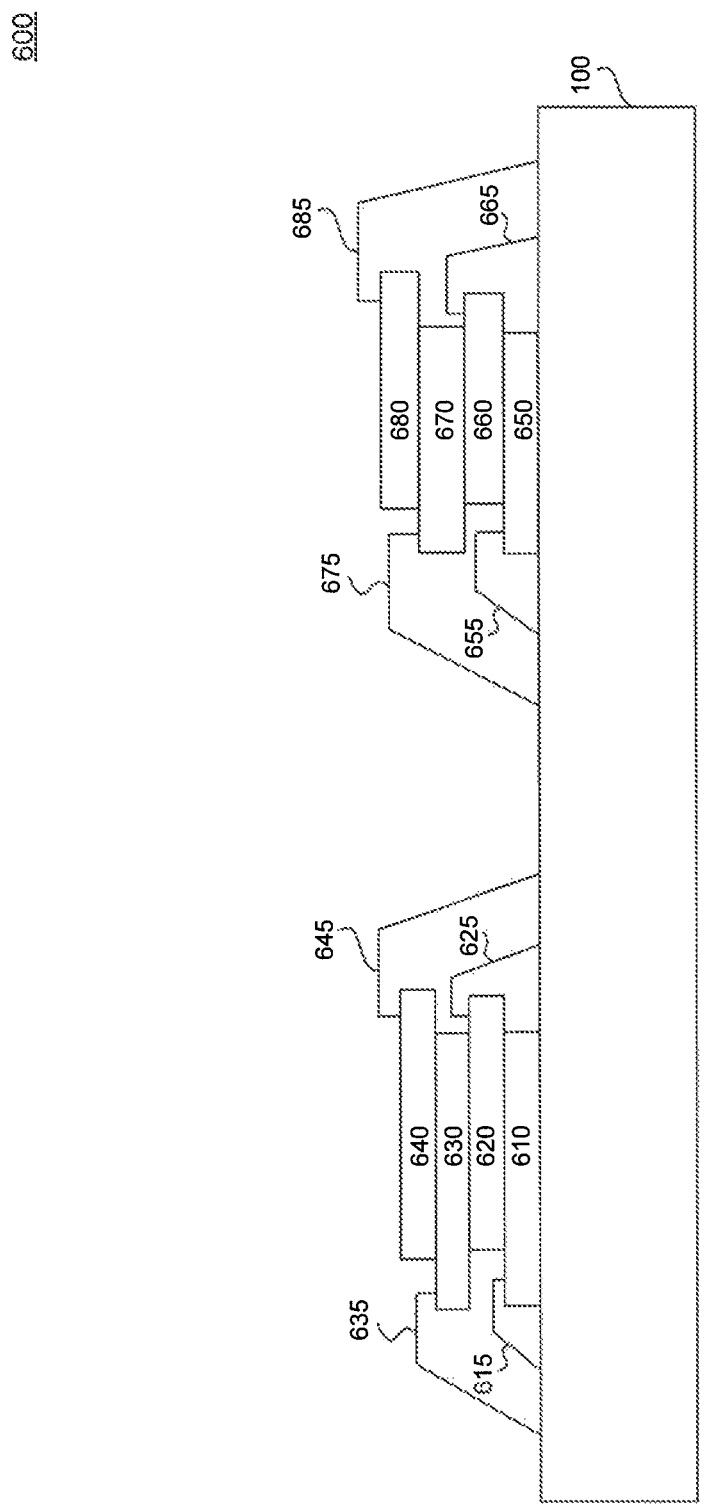

CHIP POSITIONING IN MULTI-CHIP PACKAGE

BACKGROUND

1. Field

Embodiments included herein generally relate to chip packaging. More particular, embodiments relate to positioning multiple ICs relative to one another and/or an underlying substrate in a multi-chip package.

2. Background

Wire bonding is a method of providing interconnections between an integrated circuit (IC) and an underlying substrate (e.g., printed circuit board). Typically, the interconnections are provided between pads on the IC and corresponding pads on the underlying substrate. It is important to accurately position the IC on the underlying substrate such that, for example, interconnections from adjacent pads on the IC and underlying substrate donot cross or short with one another. The proper alignment of the IC on the underlying substrate also impacts IC packaging requirements such as, for example, wire bond angle, wire length, and wireloops.

The above design considerations in IC/substrate alignment are further exacerbated in multi-chip packages. In multi-chip packages, multiple ICs in the package are oftentimes required to maintain proper alignment between one another as well as the underlying substrate to avoid issues such as, for example, interconnects crossing or shorting with one another. Inaccurate positioning of at least one IC in the multi-chip package can result in an inoperable and/or unreliable packaged IC chip.

SUMMARY

Therefore, there is a need to accurately position multiple ICs relative to one another and/or an underlying substrate in a multi-chip package.

An embodiment of the present invention includes a substrate package. The substrate package includes a first set of reference markers and a second set of reference markers. The first set of reference markers provides a first alignment for positioning a first integrated circuit (IC) and a second alignment for positioning a second IC on the substrate package. Further, the second set of reference markers provides confirmation of the first alignment and the second alignment, where the second set of reference markers is disposed at a different location on the substrate package than the first set of reference markers.

Another embodiment includes a method for multi-chip packaging. The method includes positioning a first integrated circuit (IC) on a substrate package based on a first set of reference markers; confirming a first alignment of the first IC based on a second set of reference markers; positioning a second IC on the substrate package based on the first set of reference markers, where the second IC is stacked onto the first IC; and, confirming a second alignment of the second IC based on the second set of reference markers, where the second set of reference markers is disposed at a different location on the substrate package than the first set of reference markers.

A further embodiment includes a multi-chip package. The multi-chip package includes a first plurality of integrated circuits (ICs), a second plurality of ICs, and a substrate with the first and second plurality of ICs disposed thereon. The substrate includes a first set of reference markers to provide a first alignment for positioning at least one of the first plurality of ICs and a second alignment for positioning at least one of the second plurality of ICs on the substrate. Further, a second set of reference markers provide confirmation of the first alignment and the second alignment, where the second set of reference markers is disposed at a different location on the substrate than the first set of reference markers.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to person of ordinary skill in the relevant art based on the teachings contained herein.

BRIEF DESCRIPTION OF THE DRAWINGS

The accompanying drawings, which are incorporated herein and form a part of the specification, ill ustrate embodiments of the present invention and, together with the description, further serve to explain the principles of the invention and to enable a person skilled in the relevant art to intake and use the invention.

FIG. 5 is an illustration of a side view of an example multi-chip package with integrated circuits in a straight stack (or "ladder") arrangement.

FIG. 6 is an illustration of a side view of an example multi-chip package with integrated circuits in a side-by-side arrangement.

DETAILED DESCRIPTION

The following detailed description refers to the accompanying drawings that illustrate exemplary embodiments consistent with this invention. Other embodiments are possible, and modifications can be made to the embodiments within the spirit and scope of the invention. Therefore, the detailed description is not meant to limit the scope of the invention. Rather, the scope of the invention is defined by the appended claims.

It would be apparent to a person of ordinary skill in the relevant art that the present invention, as described below, can be implemented in many different embodiments of software, hardware, firmware, and/or the entities illustrated in the figures. Thus, the operational behavior of embodiments of the present invention will be described with the understanding that modifications and variations of the embodiments are possible, given the level of detail presented herein.

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one of ordinary skill in the art to effect such feature, structure, or characteristic in connection with other embodiments whether or not explicitly described.

Figure 1:
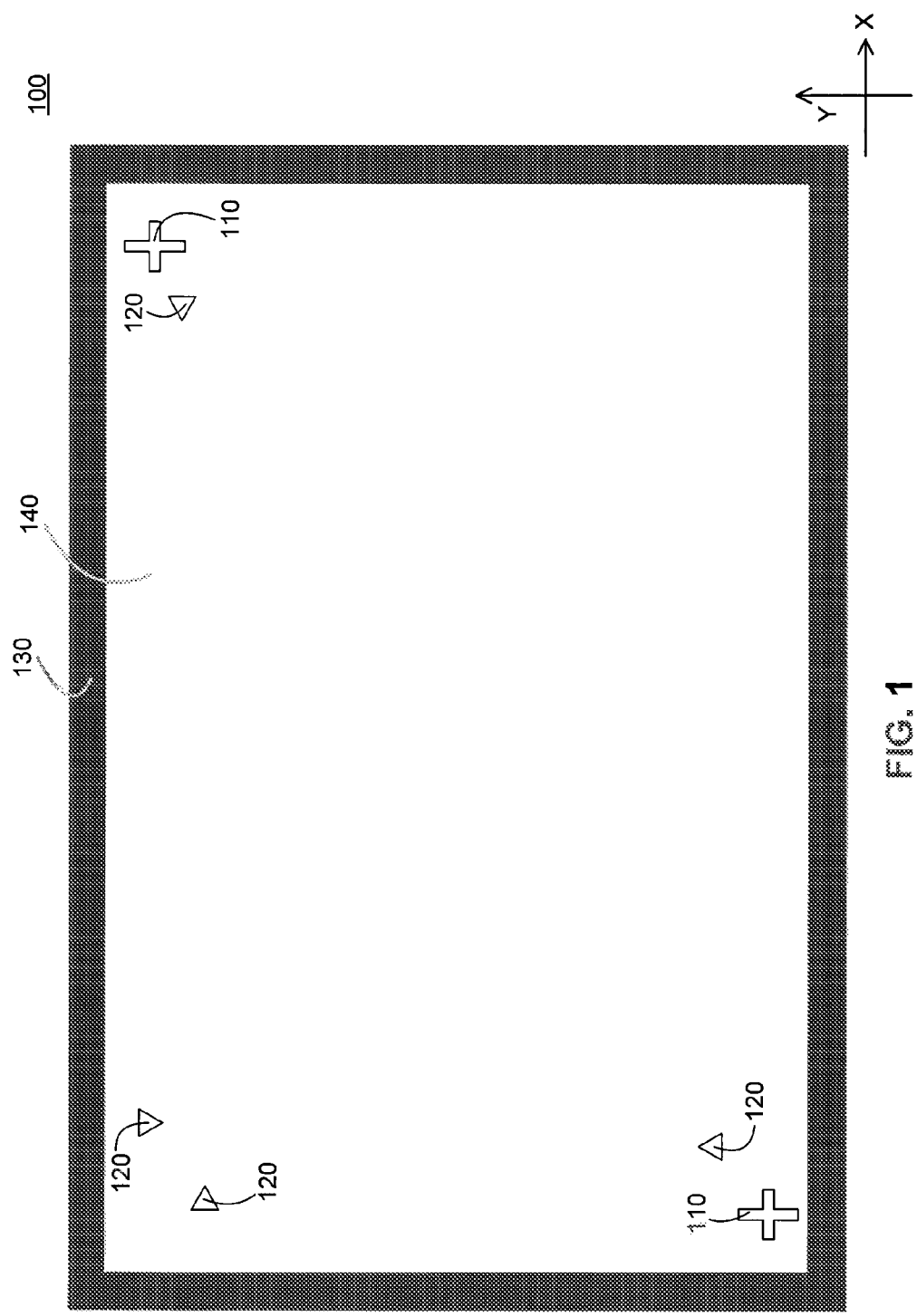
FIG. 1 is an illustration of an embodiment of a substrate package with a first set of reference markers and a second set of reference markers.

FIG. 1 is an illustration of an embodiment of a substrate package 100. Substrate package 100 includes a first set of reference markers 110, a second set of reference markers 120, a clamping surface 130, and a mold cavity surface 140. Substrate package 100 can be, for example and without limitation, a lead frame package, a small-outline integrated circuit (SOIC) package, or a ball grid array (BGA) array package. Based on the description herein, a person of ordinary skill in the relevant art will recognize that other types of packaging technologies can be implemented with the embodiments disclosed herein. These other types of packaging technologies are within the spirit and scope of the present invention.

In reference to FIG. 1, first set of reference markers 110 and second set of reference markers 120 are disposed in mold cavity surface 140 of FIG. 1. In an embodiment, first set of reference markers 110 is configured to provide a first alignment for positioning a first integrated circuit (IC) and a second alignment for positioning a second IC on substrate package 100. Second set of reference markers 120 is disposed at a different location on substrate package 100 than first set of reference markers 110, according to an embodiment of the present invention. Further, second set of reference markers 120 is configured to provide confirmation of the first alignment and the second alignment.

Figure 2:
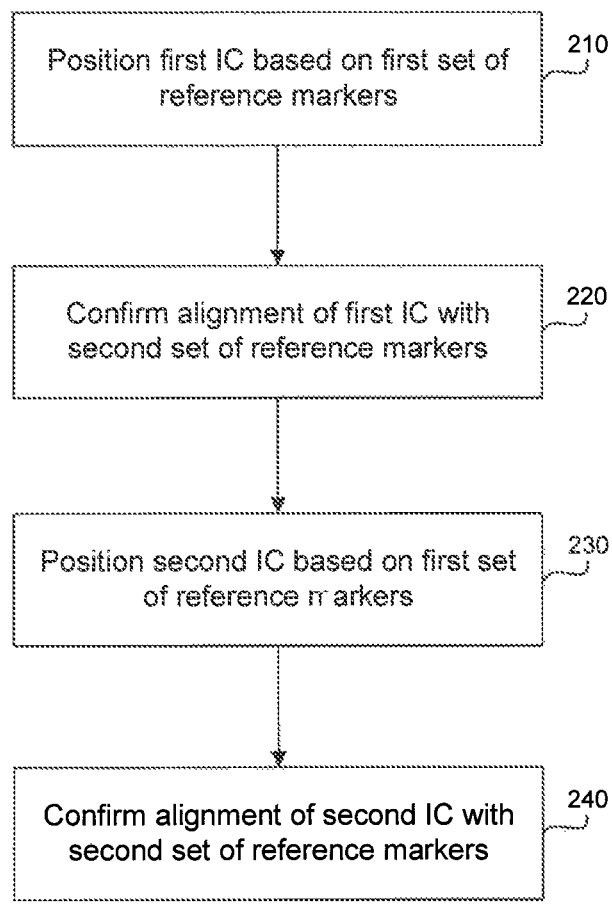
FIG. 2 is an illustration of an embodiment of a multi-chip packaging process that uses a first set of reference markers and a second set of reference markers.
Figure 3A:
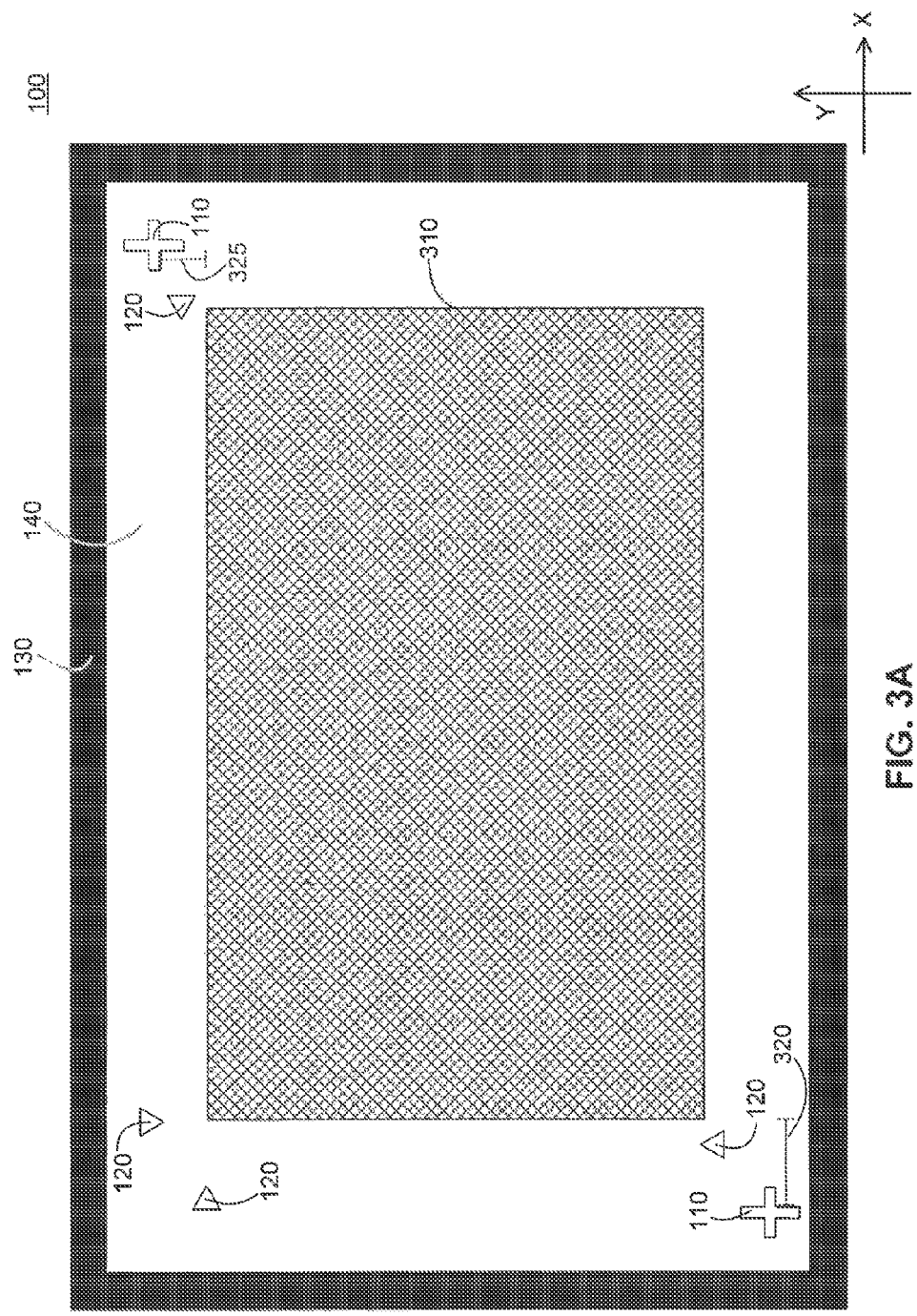
FIGS. 3A-3D are illustrations of example integrated circuits positioned on a substrate in a diagonal stack arrangement.
Figure 3B:
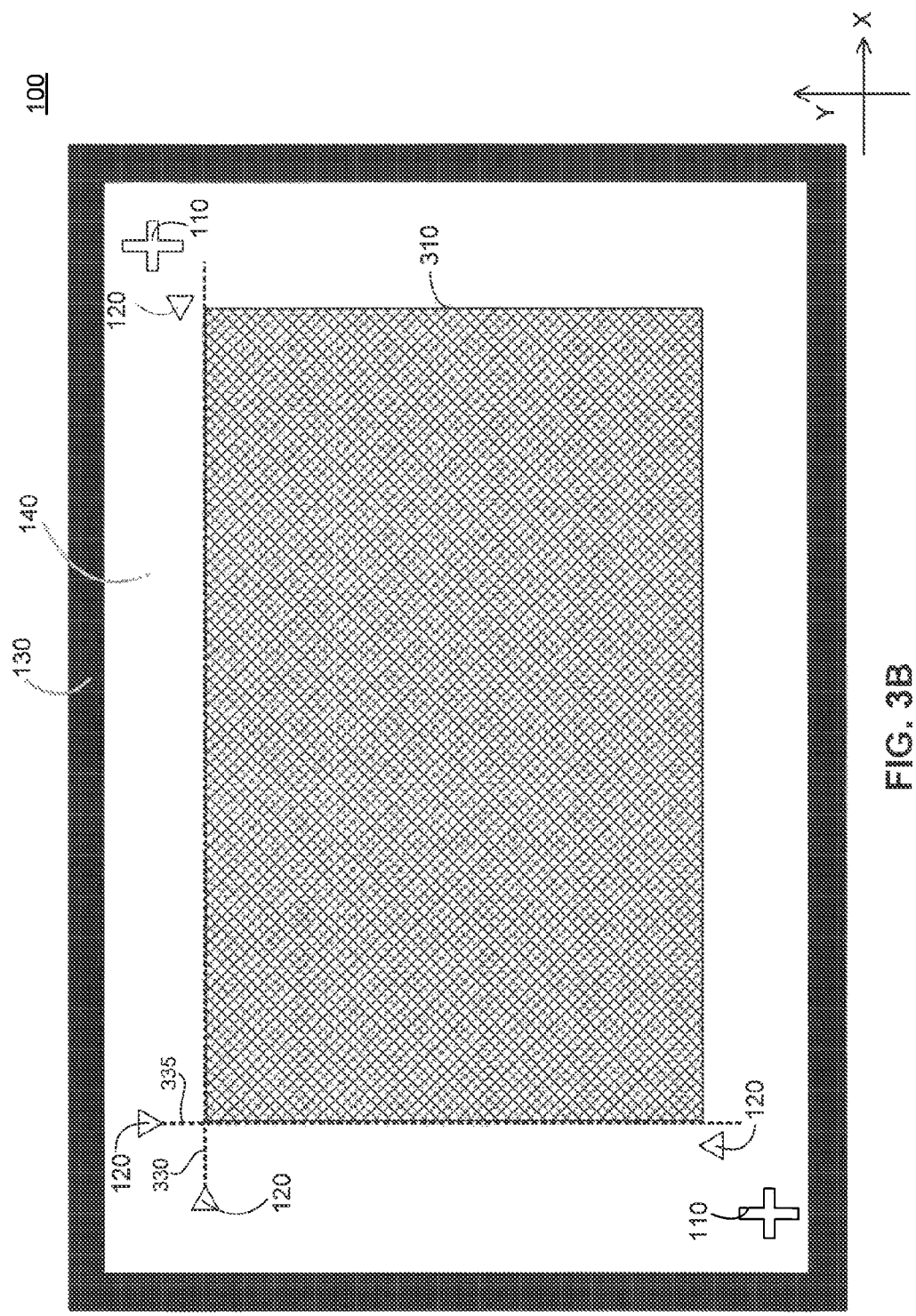

FIG. 2 is an illustration of an embodiment of a multi-chip packaging process 200 that uses first set of reference markers 110 and second set of reference markers 120. In step 210, a first IC is positioned in mold cavity surface 140 of FIG. 1 based on first set of reference markers 110. FIG. 3A is an illustration of an embodiment of an IC 310 positioned in mold cavity 140 of substrate package 100. IC 310 can be positioned in mold cavity surface 140 using an IC placement machine, which is well known to a person of ordinary skill in the relevant art. The IC placement machine can position IC 310 in a predetermined area within mold cavity surface 140 based on first set of reference markers 110, acco ding to an embodiment of the present invention. In an embodiment, the IC placement machine can align IC 310 with respect to a predetermined x-distance 320 and a predetermined y-distance 325 from first set of reference markers 110. As would be understood by a person of ordinary skill in the relevant art, other references on substrate package 100 can be used in conjunction with first set of reference markers 110 to align IC 310 such as, for example and without limitation, a logo printed on substrate package 100, indexing holes at an edge of substrate package 100, or other markings on package substrate 100 that are not designed for deliberate IC offset. For the sake of clarity and ease of explanation, these other references are not shown in FIGS. 3A-3D.

In reference to method 200 of FIG. 2, in step 220, second set of reference markers 120 is used to confirm the alignment of IC 310 within mold cavity surface 140. In an embodiment, second set of reference markers 120 is used to inspect an alignment of one or more edges of IC 310. For example, in reference to FIG. 3B, the alignment of IC 310 can be confirmed using second set of reference markers 120 located in the upper left corner of mold cavity surface 140—e.g., imaginary dotted lines 330 and 335 can be used to inspect if IC 310 is in alignment. In an embodiment, the inspection of the alignment of IC 310 based on second set of reference markers 120 can be performed by the human eye. In another embodiment, the inspection of the alignment of IC 310 can be performed by an inspection tool such as, for example and without limitation, a scanner. Based on the description herein, a person of ordinary skill in the relevant art will recognize that other inspection tools can be used. These other inspection tools are within the spirit and scope of the present invention.

Figure 3C:
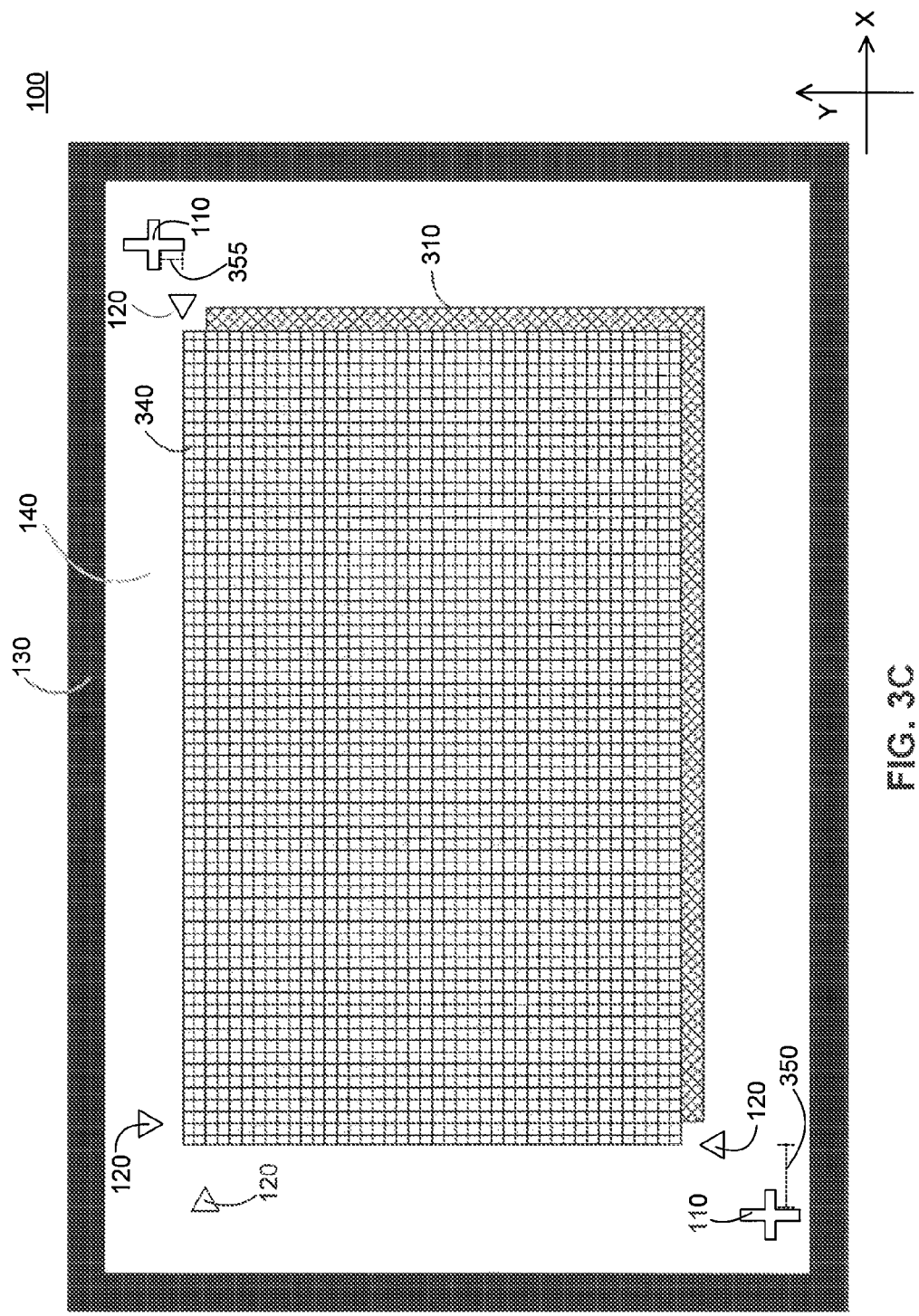
Figure 3D:
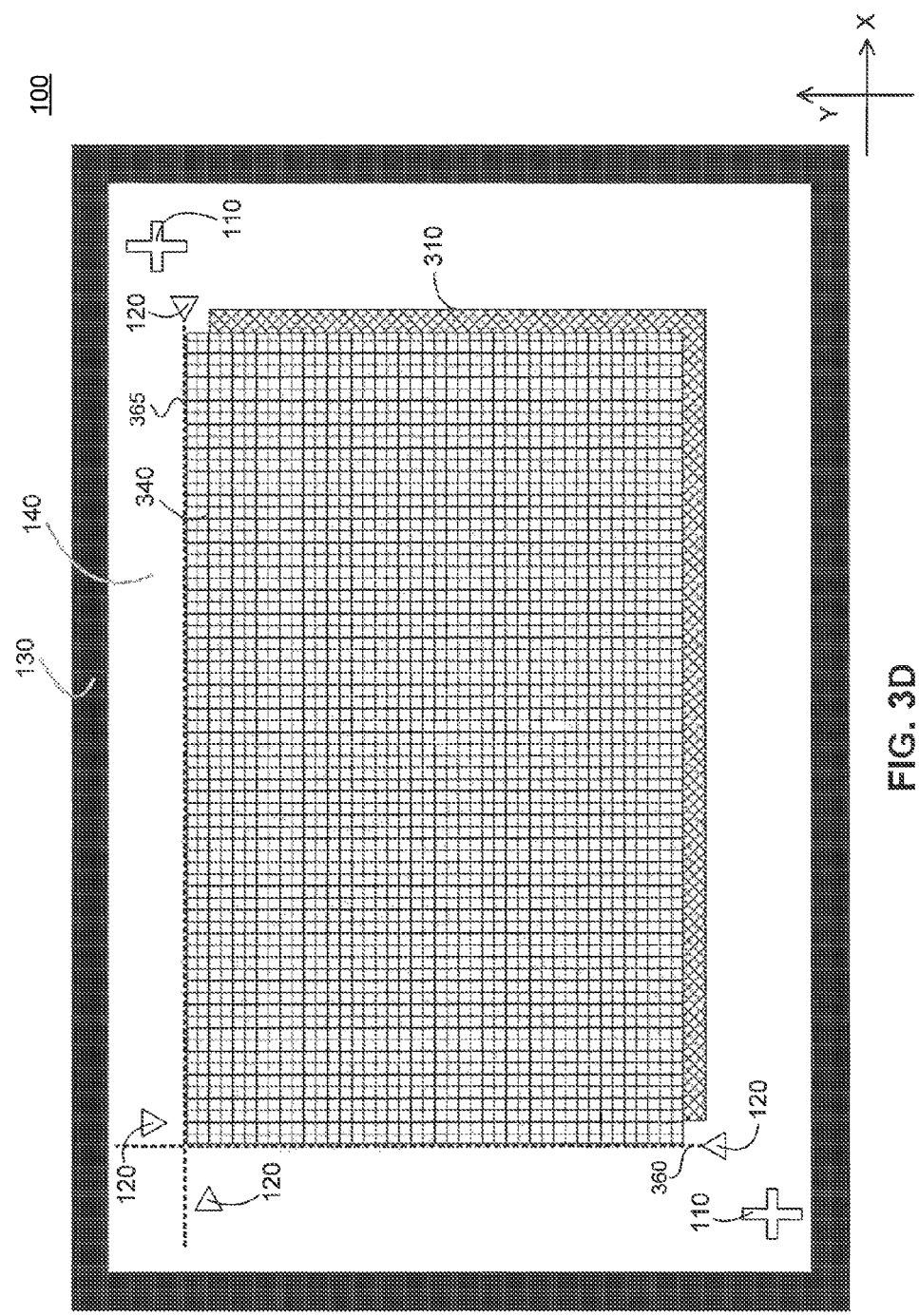

In step 230 of FIG. 2, a second IC is positioned in mold cavity surface 140 of FIG. 1 based on first set of reference markers 110. In an embodiment, the second IC is positioned (or "stacked") on top of the first IC (from step 210). FIG. 3C is an illustration of an embodiment of an IC 340 in mold cavity 140 of FIG. 1, where IC 340 is stacked on top of IC 310. Here, IC 340 is stacked onto IC 310 in a diagonal stack arrangement.

Similar to IC 310, an IC placement machine can position IC 340 in a predetermined area within mold cavity surface 140 (and on top of IC 310) based on first set of reference markers 110, according to an embodiment of the present invention. In reference to FIG. 3C, an IC placement machine can align IC 340 with respect to a predetermined x-distance 350 and a predetermined y-distance 355 from first set of markers 110, according to an embodiment of the present invention.

In step 240 of FIG. 2, second set of reference markers 120 is used to confirm the alignment of IC 340 within mold cavity surface 140. In an embodiment, second set of reference markers 120 is used to inspect an alignment of one or more edges of IC 340. For example, in reference to FIG. 3D, the alignment of IC 340 can be confirmed using second set of markers 120 located in the lower left corner and the upper right corner of mold cavity surface 140—e.g., imaginary dotted lines 360 and 365 can be used to inspect if IC 340 is in alignment. In an embodiment, the inspection of the alignment of IC 340 based on second set of reference markers 120 can be performed by the human eye. In another embodiment, the inspection of the alignment of IC 340 can be performed by an inspection tool such as, for example and without limitation, a scanner.

Figure 4:
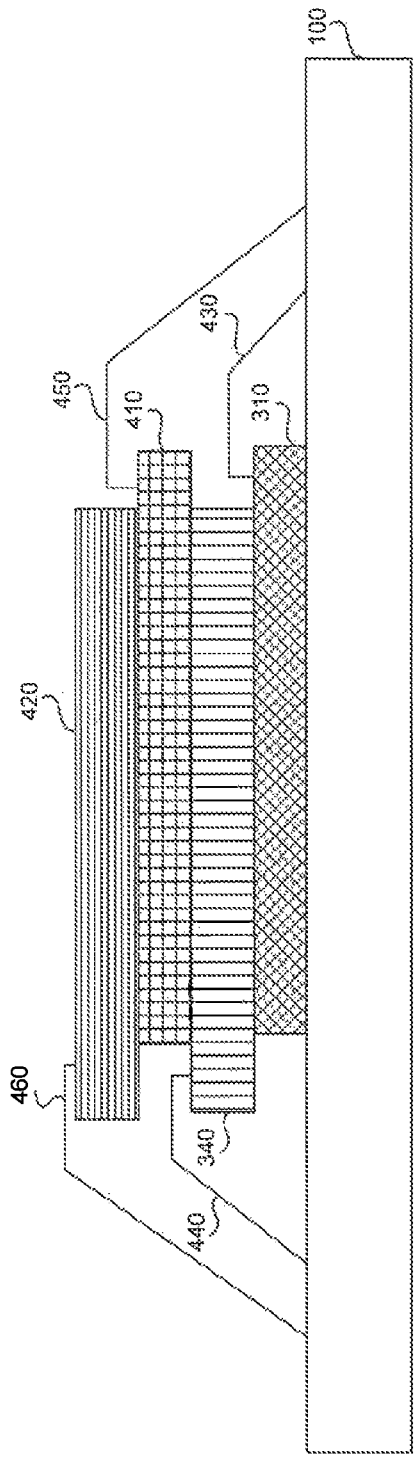
FIG. 4 is an illustration of a side view of an example multi-chip package with four integrated circuits.

Based on the description herein, a person of ordinary skill in the relevant art will recognize that method 200 can be applied to multi-chip packages (MCPs) with more than two ICs disposed on a substrate package. For example, FIG. 4 is an illustration of a side view of an example MCP 400 with four ICs, in which each of the four ICs is positioned on a substrate package 100 using the steps from method 200. MCP 400 includes IC 340 stacked onto IC 310, which is disposed on substrate package 100. In addition, using the steps of method 200, ICs 410 and 420 are disposed on substrate package 100 in a similar manner as IC 310 and IC 340, respectively.

In reference to FIG. 4, ICs 310, 340, 410, and 420 are wire-bonded to substrate package 100 via wires 430, 440, 450, and 460, respectively. An advantage, among others, of method 200 of FIG. 2 is the confirmation of alignment that the second set of reference markers (e.g., second set of markers 120 of FIG. 1) provides to MCP 400. The confirmation from the second set of reference markers can provide assurances that the manufacture of MCP 400 meets product requirements such as, for example and without limitation, wire bond angle, wire length, wireloops, proper wire embedment, proximity and separation of wires, and proper IC die to IC die spacing. As a result, wire crossing/shorting can be avoided due to the inaccurate positioning of ICs in MCPs.

Although the description of method 200 is described in the context of a diagonal stack arrangement, a person of ordinary skill in the art will recognize that method 200 is also applicable to other arrangements such as, for example and without limitation, a straight stack (o "ladder") arrangement and a side-by-side arrangement. FIG. 5 is an illustration of a side view of an example MCP 500 with ICs in a straight stack (or "ladder") arrangement that can be manufactured using the steps of method 200. MCP 500 includes ICs 510-540 in a straight stack (or "ladder") arrangement, in which ICs 510-540 are wire-bonded to substrate package 100 via wires 550-580, respectively. FIG. 6 is an illustration of a side view of an example MCP 600 with ICs in a side-by-side arrangement. MCP 600 includes two diagonal stack arrangements, where a first arrangement includes Its 610-640 and a second arrangement includes ICs 650-680. The first arrangement of ICs is wire-bonded to substrate package 100 via wires 615, 625, 635, and 645. Similarly, the second arrangement of ICs is wire-bonded to substrate package 100 via wires 655, 665, 675, and 685. In reference to FIG. 1, based on the description herein, a person of ordinary skill in the relevant art will recognize that first set of reference markers 110 and second set of reference markers 120 can be located in various areas of substrate package 100 to position and confirm the alignment of the ICs in FIGS. 4-6.

Figure 7A:
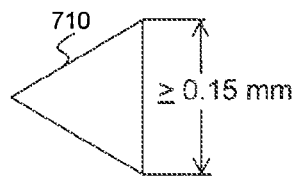
FIGS. 7A-7D are illustrations of embodiments of shapes and sizes for a set of reference markers.

Further, in reference to FIG. 1, first set of reference markers 110 and second set of reference markers 120 can have various shapes and sizes. FIGS. 7A-7D are illustrations of embodiments of shapes and sizes for first set of reference markers 110 and second set of reference markers 120. FIG. 7A is an illustration of an embodiment of a triangle-shaped reference marker 710. In an embodiment, at least one side of the triangle is at least 0.15 mm. The 0.15 mm dimension is selected based on a minimum dimension that is both visible and accurate for the human eye to confirm an alignment of an IC disposed on a package substrate (e.g., alignment of IC 310 on substrate package 100 in FIG. 3), according to an embodiment of the present invention. One or more dimensions of the triangle-shaped reference marker 710 in FIG. 7A can be less than 0.15 mm. For example, if an inspection tool (e.g., scanner) is used to confirm the alignment of the IC, then one or more dimensions of triangle-shaped reference marker 710 can be set to a minimum dimension based on the accuracy of the inspection tool (e.g., less than 0.15 mm).

Figure 7B:
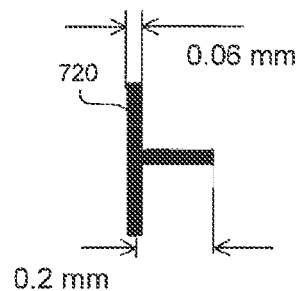
Figure 7C:
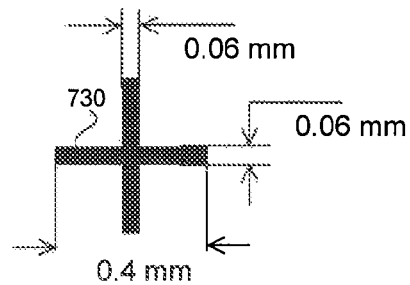
Figure 7D:
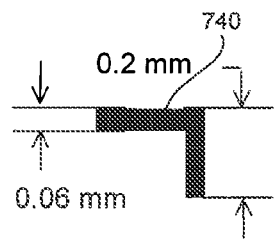

FIGS. 7B-7D are illustrations of additional embodiments of shapes and sizes for first set of reference markers 110 and second set of reference markers 120. In FIG. 7B, first set of reference markers 110 and second set of reference markers 120 can have a "T-shaped" structure 720, in which at least one dimension of the structure is 0.2 mm. In FIG. 7C, first set of reference markers 110 and second set of reference markers 120 can have a "cross-shaped" structure 730, in which at least one dimension of the structure is 0.4 mm. Further, in FIG. 7D, first set of reference markers 110 and second set of reference markers 120 can have an "L-shaped" structure 740, in which at least one dimension is 0.2 mm. Based on the description herein, a person of ordinary skill in the relevant art will recognize that other types of structures with varying dimensions can be used for first set of reference markers 110 and second set of reference markers 120. These other types of structures with varying dimensions include, but are not limited to, symbols (e.g., asterisk, dollar sign, ampersand, "@" symbol, pound sign, and caret symbol) and alphanumeric characters (e.g., digits 0-9 and letters A-Z). The symbols and alphanumeric characters can vary in size and dimension. Further, structures 710-740 of FIGS. 7A-7D, respectively, the symbols, and the alphanumeric characters can be positioned at various locations of a package substrate (e.g., substrate package 100 of FIG. 1) and are not limited to corner regions of the package substrate. For example, in reference to FIG. 1, first set of reference markers 110 and second set of reference markers 120 can be positioned at corner regions of substrate package 100, non-corner regions of substrate package 100, or a combination thereof.

The embodiments aLove describe an MCP with a single base IC (e.g., IC 310 of FIGS. 3A-3D) disposed on a substrate package (e.g., substrate package 100), in which one or more additional ICs are positioned (or "stacked") on the single base IC. In addition to the single base IC arrangement, embodiments of the present, invention can also be applied to arrangements with multiple base ICs such as, for example and without limitation, a matrix arrangement of ICs. In an embodiment, a set of, reference markers can be used during a setup procedure for placement of the multiple base ICs on a substrate package. This set of reference markers is also referred to herein as "matrix teaching fiducials."

Figure 8A:
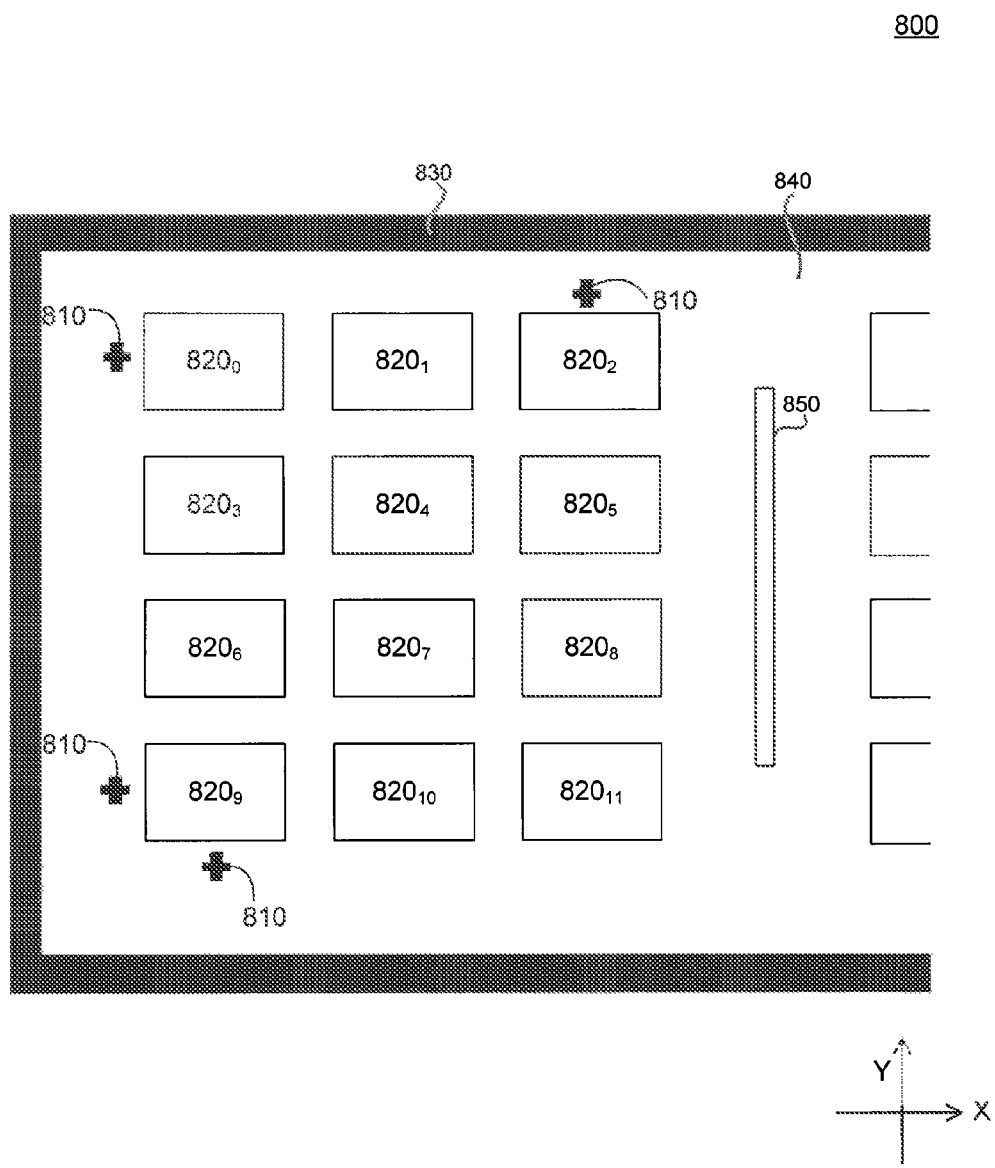
FIGS. 8A and 8B are illustrations of an embodiment of a four-block package substrate with matrix teaching fiducials.

FIG. 8A is an illustration of an embodiment of a portion of a four-block package substrate 800 with matrix teaching fiducials 810. For the sake of clarity and ease of explanation, FIG. 8A illustrates one-quarter of four-block package substrate 800. Four-block package substrate 800 includes matrix teaching fiducials 810, a matrix arrangement of ICs $820_{11\text{-}0}$, a clamping surface 830, a mold cavity surface 840, and a divider portion 850 that separates each quarter portion of substrate package 800.

Figure 8B:
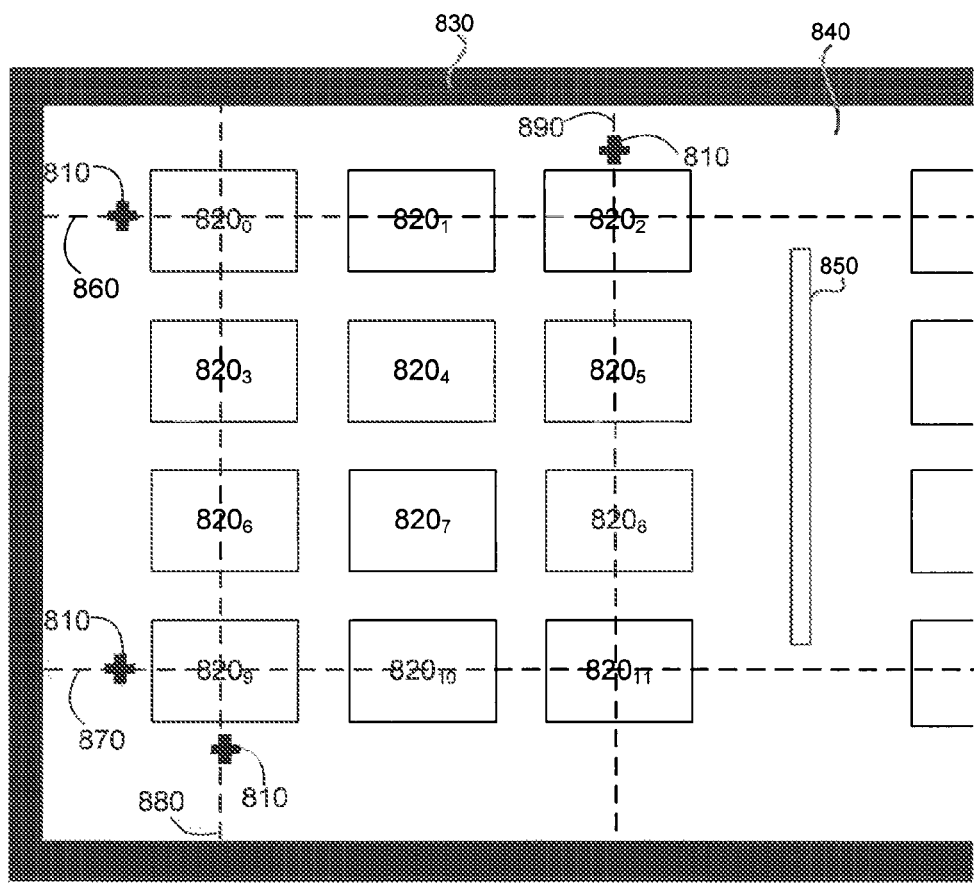

In an embodiment, matrix teaching fiducials 810 are disposed in mold cavity surface 840 and can be used to align the matrix arrangement of ICs $820_{11\text{-}0}$ within mold cavity surface 840. In an embodiment, matrix teaching fiducials 810 can include four reference markers that can be used to align the matrix arrangement of ICs $820_{11\text{-}0}$ with respect to x- and y-axes of package substrate 800. For example, in reference to FIG. 8B, imaginary dotted lines 860, 870, 880, and 890 define four corners within mold cavity surface 840 that can be used to confirm the alignment of the matrix arrangement of ICs $820_{11\text{-}0}$.

In an embodiment, the alignment of the matrix arrangement of ICs $820_{11\text{-}0}$ can be confirmed by inspecting that the top left corner formed by imaginary dotted lines 860 and 880 intersects at or proximate to the center of IC $820_0$; the top right corner formed by imaginary dotted lines 860 and 890 intersects at or proximate to the center of IC $820_2$; the bottom left corner formed by imaginary dotted lines 870 and 880 intersects at or proximate to the center of IC $820_9$; and, the bottom right corner formed by imaginary lines 870 and 890 intersects at or proximate to the center of IC $820_{11}$. The inspection can be performed by the human eye, according to an embodiment of the present invention. In another embodiment, the inspection can be performed by an inspection tool such as, for example and without limitation, a scanner.

Figure 9:
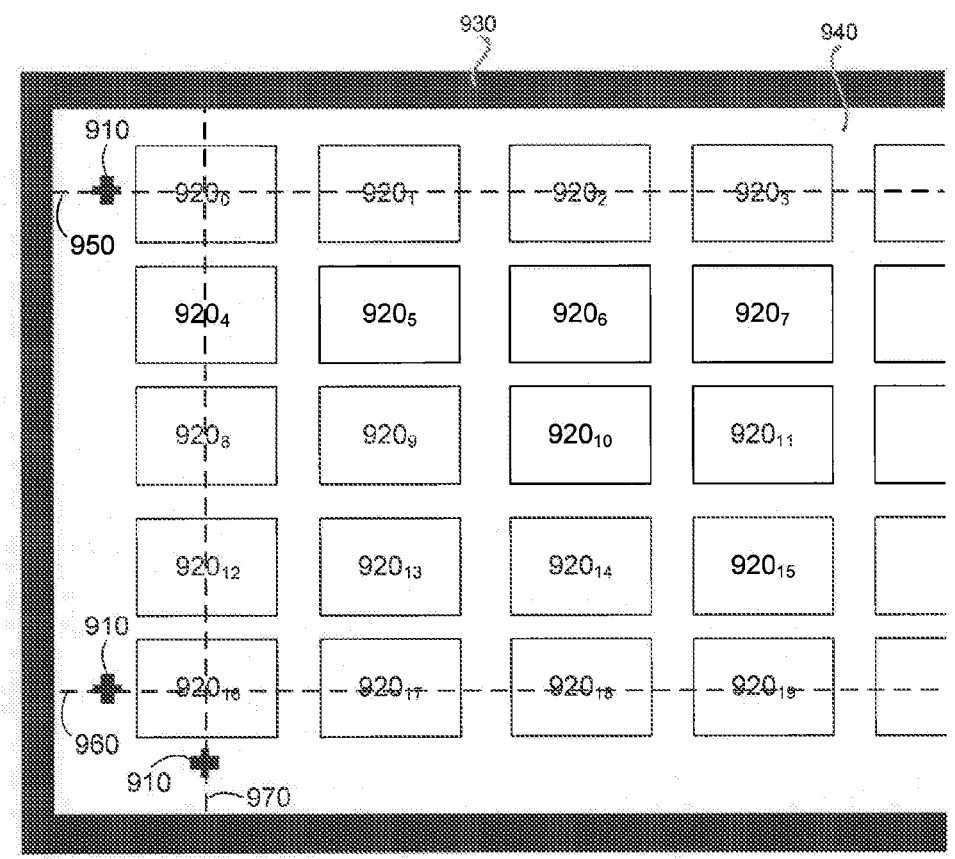
FIG. 9 is an illustration of an embodiment of a full-block package substrate with matrix teaching fiducials.

Matrix teaching fiducials can be used in other types of matrix arrangement of ICs disposed on a substrate package. For example, FIG. 9 is an illustration of an embodiment of a full-block package substrate 900 with matrix teaching fiducials 910. For the sake of clarity and ease of explanation, FIG. 9 illustrates a portion of full-block package substrate 900. Full-block package substrate 900 includes matrix teaching fiducials 910, a matrix arrangement of ICs $920_{19\text{-}0}$, a clamping surface 930, and a mold cavity surface 940.

In an embodiment, matrix teaching fiducials 910 are disposed in mold cavity surface 940 and can be used to align the matrix arrangement of ICs $920_{19\text{-}0}$ within mold cavity surface 940. In an embodiment, matrix teaching fiducials 910 can include four reference markers that can be used to align the matrix arrangement of ICs $920_{19\text{-}0}$ with respect to x- and y-axes of package substrate 900. For the sake of clarity and ease of explanation, three matrix teaching fiducials 910 are illustrated in FIG. 9. For example, in reference to FIG. 9, imaginary dotted lines 950 and 960 can be used to confirm the alignment of the matrix arrangement of ICs $920_{19\text{-}0}$ such that the top row of the matrix (e.g., ICs $920_0$, $920_1$, $920_2$, and $920_3$) is spaced from the top edge of package substrate 900 in substantially an equidistant manner as the bottom row of the matrix (e.g., ICs $920_{16}$, $920_{17}$, $920_{18}$, and $920_{19}$) is spaced from the bottom edge of package substrate 900. Further, imaginary dotted line 970 can be used to confirm the alignment of the matrix arrangement of ICs $920_{19\text{-}0}$ such that the left column of the matrix (e.g., ICs $920_0$, $920_4$, $920_8$, $920_{12}$, and $920_{16}$) is spaced from the left edge of package substrate 900 in substantially an equidistant manner as the right column of the matrix is spaced from the right edge of package substrate 900 (not illustrated in FIG. 9).

In an embodiment, the alignment of the matrix arrangement of ICs $920_{19\text{-}0}$ can be confirmed by inspecting that imaginary dotted line 950 intersects through the center or is proximate to the center of ICs $920_0$, $920_1$, $920_2$, and $920_3$. Similarly, the alignment can be confirmed by inspecting that imaginary dotted line 960 intersects through the center or is proximate to the center of ICs $920_{16}$, $920_{17}$, $920_{18}$, and $920_{19}$, according to an embodiment of the present invention. Further, the alignment can be confirmed by inspecting that imaginary dotted line 970 intersects through the center or is substantially proximate to the center of ICs $920_0$, $920_4$, $920_8$, $920_{12}$, and $920_{16}$. Although not illustrated in FIG. 9, the alignment of ICs along the right edge of the matrix arrangement of ICs (proximate to the right edge of package substrate 900) can be confirmed in a similar manner as the inspection of imaginary dotted line 970. The inspection can be performed by the human eye, according to an embodiment of the present invention. In another embodiment, the inspection can be performed by an inspection tool such as, for example and without limitation, a scanner.

Figure 10:
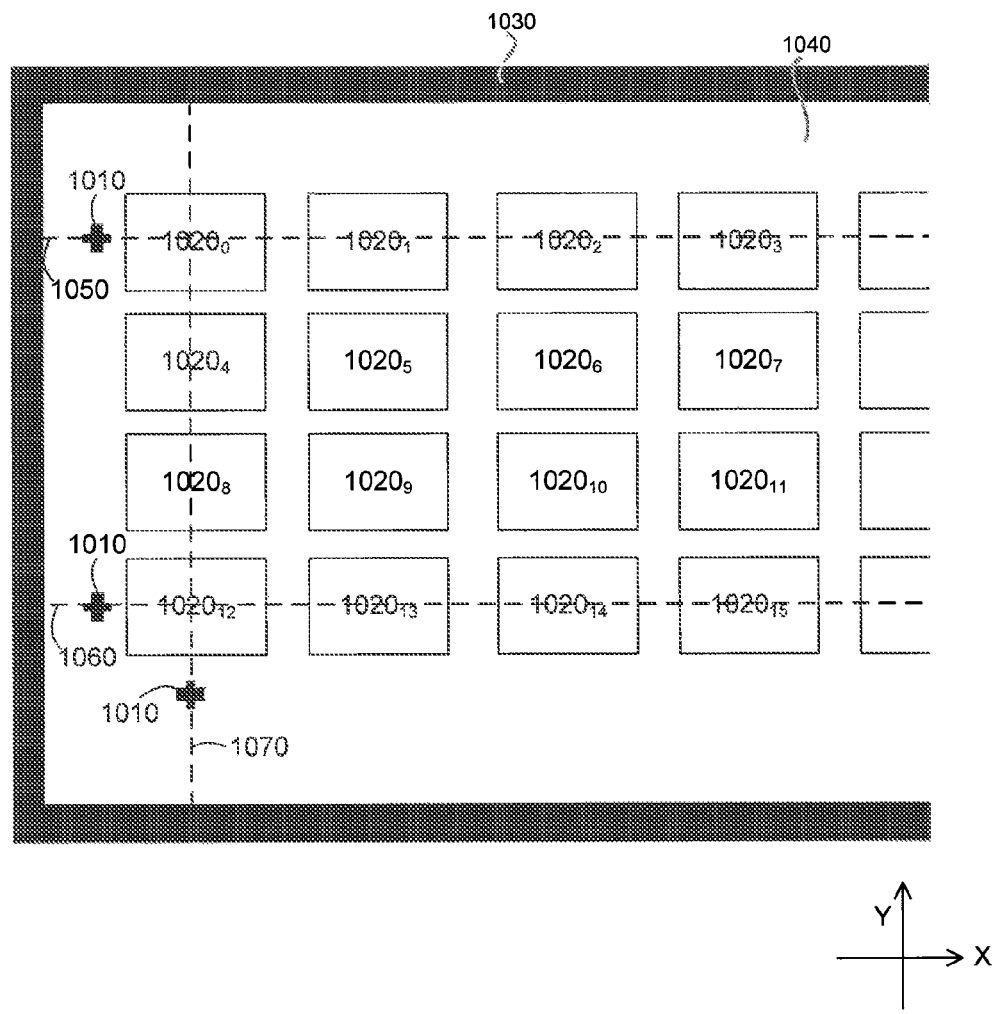
FIG. 10 is an illustration of an embodiment of offset full-block package substrate with matrix teaching fiducials.

FIG. 10 is an illustration of an offset full-block package substrate 1000 with matrix teaching fiducials 1010. For the sake of clarity and ease of explanation, FIG. 10 illustrates a portion of offset full-block package substrate 1010. Offset full-block package substrate 1000 includes matrix teaching fiducials 1010, a matrix arrangement of ICs $1020_{15\text{-}0}$, a clamping surface 1030, and a mold cavity surface 1040.

In an embodiment, matrix teaching fiducials 1010 are disposed in mold cavity surface 1040 and can be used to align the matrix arrangement of ICs $1020_{15\text{-}0}$ within mold cavity surface 1040. In an embodiment, matrix teaching fiducials 1010 can include four reference markers that can be used to align the matrix arrangement of ICs $1020_{15\text{-}0}$ with respect to a y-axis of package substrate 1000. For the sake of clarity and ease of explanation, three matrix teaching fiducials 1010 are illustrated in FIG. 10. For example, in reference to FIG. 10, imaginary dotted lines 1050 and 1060 can be used to confirm the alignment of the matrix arrangement of ICs $1020_{15\text{-}0}$ such that the top row of the matrix (e.g., ICs $1020_0$, $1020_1$, $1020_2$, and $1020_3$) is spaced from the top edge of package substrate 1000 in an offset (or unequal) manner as the bottom row of the matrix (e.g., ICs $1020_{12}$, $1020_{13}$, $1020_{14}$, and $1020_{15}$) is spaced from the bottom edge of package substrate 1000. Further, imaginary dotted line 1070 can be used to confirm the alignment of the matrix arrangement of ICs $1020_{15\text{-}0}$ such that the left column of the matrix (e.g., ICs $1020_0$, $1020_4$, $1020_8$, and $1020_{12}$) is spaced from the left edge of package substrate 1000 in substantially an equidistant manner as the right column of the matrix is spaced from the right edge of package substrate 1000 (not illustrated in FIG. 10).

In an embodiment, the alignment of the matrix arrangement of ICs $1020_{15\text{-}0}$ can be confirmed by inspecting that imaginary dotted line 1050 intersects through the center or is proximate to the center of ICs $1020_0$, $1020_1$, $1020_2$, and $1020_3$. Similarly, the alignment can be confirmed by inspecting that imaginary dotted line 1060 intersects through the center or is proximate to the center of ICs $1020_{12}$, $1020_{13}$, $1020_{14}$, and $1020_{15}$, according to an embodiment of the present invention. Further, the alignment can be confirmed by inspecting that imaginary dotted line 1070 intersects through the center or is substantially proximate to the center of ICs $1020_0$, $1020_4$, $1020_8$, and $1020_{12}$. Although not illustrated in FIG. 10, the alignment of ICs along the right edge of the matrix arrangement of ICs (proximate to the right edge of package substrate 1000) can be confirmed in a similar manner as the inspection of imaginary dotted line 1070. The inspection can be performed by the human eye, according to an embodiment of the present invention. In another embodiment, the inspection can be performed by an inspection tool such as, for example and without limitation, a scanner.

Further, in reference to FIGS. 8-10, matrix teaching fiducials 810, 910, and 1010 can have various shapes and sizes such as, for example and without limitations, the shapes and sizes described above with respect to FIGS. 7A-7D. Based on the description herein, a person of ordinary skill in the relevant art will recognize that other types of structures with varying dimensions can be used for matrix teaching fiducials 810, 910, and 1010. These other types of structures with varying dimensions include, but are not limited to, symbols (e.g., asterisk, dollar sign, ampersand, "@" symbol, pound sign, and caret symbol) and alphanumeric characters (e.g., digits 0-9 and letters A-Z). The symbols and alphanumeric characters can vary in size and dimension. Further, structures 710-740 of FIGS. 7A-7D, respectively, the symbols, and the alphanumeric characters can be positioned at various locations of a package substrate (e.g., package substrate 800 of FIG. 8, package substrate 900 of FIG. 9, and package substrate 1000 of FIG. 10) and are not limited to corner regions of the package substrate. For example, in reference to FIGS. 8, matrix teaching fiducials 810 can be positioned at corner regions of package substrate 800, non-corner regions of package substrate package 800, or a combination thereof.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventors, and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the relevant art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A substrate package comprising:
a first set of reference markers disposed on and in physical contact with the substrate package to provide a first alignment for positioning a first integrated circuit (IC) and a second alignment for positioning a second IC on the substrate package; and
a second set of reference markers disposed on and in physical contact with the substrate package to provide confirmation of the first alignment and the second alignment, wherein the second set of reference markers is disposed at a different location on the substrate package than the first set of reference markers.

2. The substrate package of claim 1, wherein the second set of reference markers is used to align the second IC to the first IC in a diagonal stack arrangement, a straight stack arrangement, or a side-by-side arrangement.

3. The substrate package of claim 1, wherein the first set and the second set of reference markers are disposed in a mold cavity surface of the substrate package.

4. The substrate package of claim 1, wherein at least one reference marker in the second set of reference markers comprises a triangle-shaped structure, a T-shaped structure, a cross-shaped structure, or an L-shaped structure.

5. The substrate package of claim 1, wherein at least one reference marker in the second set of reference markers has at least one dimension greater than or equal to 0.15 mm.

6. The substrate package of claim 1, wherein the first IC is disposed on the substrate package based on the first set of reference markers and the second IC is disposed on the first IC based on the first set of reference markers.

7. A multi-chip package comprising:
a first plurality of integrated circuits (ICs);
a second plurality of ICs; and
a substrate with the first and second plurality of ICs disposed thereon, wherein the substrate comprises:
a first set of reference markers disposed on and in physical contact with the substrate to provide a first alignment for positioning at least one of the first plurality of ICs and a second alignment for positioning at least one of the second plurality of ICs on the substrate; and
a second set of reference markers disposed on and in physical contact with the substrate to provide confirmation of the first alignment and the second alignment, wherein the second set of reference markers is disposed at a different location on the substrate than the first set of reference markers.

8. The multi-chip package of claim 7, further comprising:
a first interconnect to provide a first wire bond between the at least one of the first plurality of ICs and the substrate; and
a second interconnect to provide a second wire bond between the at least one of the second plurality of ICs and the substrate.

9. The multi-chip package of claim 7, wherein the substrate comprises a lead frame package, a small-outline integrated circuit (SOIC) package, or a ball grid array (BGA) array package.

10. The multi-chip package of claim 7, wherein the second set of reference markers is used to align the second IC to the first IC in a diagonal stack arrangement, a straight stack arrangement, or a side-by-side arrangement.

11. The multi-chip package of claim 7, wherein the first set and the second set of reference markers are disposed in a mold cavity surface of the substrate.

12. The multi-chip package of claim 7, wherein at least one reference marker in the second set of reference markers comprises a triangle-shaped structure, a T-shaped structure, a cross-shaped structure, or an L-shaped structure.

13. The multi-chip package of claim 7, wherein at least one reference marker in the second set of reference markers has at least one dimension greater than or equal to 0.15 mm.

14. The multi-chip package of claim 7, wherein the first IC is disposed on the substrate based on the first set of reference markers and the second IC is disposed on the first IC based on the first set of reference markers.

* * * * *